(12) United States Patent
Johnston

(10) Patent No.: US 8,158,886 B2
(45) Date of Patent: Apr. 17, 2012

(54) RECYCLING PRINTED CIRCUIT BOARDS

(75) Inventor: Philip Johnston, Tewkesbury (GB)

(73) Assignee: Trackwise Designs Limited (GB)

( * ) Notice: Subject to any disclaimer, the term of this patent is extended or adjusted under 35 U.S.C. 154(b) by 1079 days.

(21) Appl. No.: 11/720,312

(22) PCT Filed: Nov. 24, 2005

(86) PCT No.: PCT/GB2005/004510
§ 371 (c)(1),
(2), (4) Date: Jan. 2, 2008

(87) PCT Pub. No.: WO2006/056778
PCT Pub. Date: Jun. 1, 2006

(65) Prior Publication Data
US 2008/0251278 A1    Oct. 16, 2008

(30) Foreign Application Priority Data
Nov. 25, 2004 (GB) .................................. 0425917.2

(51) Int. Cl.
*H05K 1/00* (2006.01)
(52) U.S. Cl. ........................................................ 174/250
(58) Field of Classification Search .................. 174/250; 29/403.1–403.3; 228/19, 20.1, 119, 264
See application file for complete search history.

(56) References Cited

U.S. PATENT DOCUMENTS

| 6,641,712 B1 * | 11/2003 | Gibson et al. ................. 205/349 |
| 6,675,454 B1 * | 1/2004 | Marschner ..................... 29/403.3 |
| 7,107,661 B2 * | 9/2006 | Kamimura et al. ........... 29/403.4 |

FOREIGN PATENT DOCUMENTS

| DE | 4337970 | | 5/1995 |
| EP | 1 484 119 | A1 | 12/2004 |
| JP | 57-080021 | | 5/1982 |
| JP | 2000127094 | A | 5/2000 |
| JP | 2003126783 | A | 5/2003 |
| JP | 2003234568 | A | 8/2003 |
| JP | 2004022607 | A | 1/2004 |
| JP | 2005000841 | A | 1/2005 |
| KR | 20010070721 | A | 7/2001 |
| KR | 20030042949 | A | 6/2003 |
| WO | WO 03/051545 | A1 | 6/2003 |

\* cited by examiner

*Primary Examiner* — Jeremy Norris
*Assistant Examiner* — Tremesha S Willis
(74) *Attorney, Agent, or Firm* — Seed IP Law Group PLLC

(57) ABSTRACT

A method of recycling radio frequency printed circuit boards comprising track material printed on a laminate having a known dielectric constant using the steps of separating the substrate of one or more circuit boards from the track material; and processing the separated material to form a thin layer of substrate material suitable for relaminating with track material to provide a product for use in the manufacture of a further radio frequency printed circuit board. The method may separate the material from the laminate by grinding or use of an etchant.

5 Claims, No Drawings

RECYCLING PRINTED CIRCUIT BOARDS

BACKGROUND

1. Technical Field

This invention relates to printed circuits, and in particular to an improved method of processing printed circuits.

2. Description of the Related Art

Many types of printed circuit board are available in the marketplace. One specialist type of product is that used in the manufacture of radio frequency (RF) products such as microwave antennas for the mobile telephony network. This product is expensive because it is typically made from a laminate of copper laminated to a PTFE and glass fiber matrix substrate (PTFE: commonly known by the trademark Teflon). A ceramic is also sometimes included in the composition of the substrate. Manufacturers of this raw matrix material go to great lengths to ensure that the ratio of PTFE to glass fiber is accurately controlled within the substrate in order to control the RF properties of the material.

When a product, such as a microwave antenna, reaches the end of its useful life or is otherwise taken out of service, it has, until now been thrown away as waste. Recent trends in legislation have introduced incentives for recycling, often in the form of penalties for producing waste of raw materials. This has led to an increase in the recycling of products including the recycling of PCB's.

At present, the only recycling of old printed circuit boards has been the extraction of the precious metals from the printed circuit or circuit assembly with the remainder of the material being thrown away. Conventional wisdom is that the metal of or on the tracks is of value, with the other material simply being processed with other low-grade waste to be used in low-cost recycled products such as plastic pallets.

BRIEF SUMMARY

According to a first aspect, the invention comprises a method of recycling radio frequency printed circuit boards comprising track material printed on a laminate having a known dielectric constant using the steps of: separating the substrate of one or more circuit boards from the track material; and processing the separated material to form a thin layer of substrate material suitable for relaminating with track material to provide a product for use in the manufacture of a further radio frequency printed circuit board.

The method may be applied to the recycling of manufacturing waste offcut material which would otherwise be wasted during the manufacture of printed circuit boards. It may also be applied to the recycling of end of life pcbs. The method may be applied just to offcuts or to a mix of offcuts and end of life product.

The present invention therefore provides a method whereby the substrate from used PCBs is recycled to provide fresh laminate which can be reused to form new PCBs. This is completely contrary to present practice in which attempts are only made to retain the metal of or on the tracks. The applicant has appreciated that there is a financial as well as environmental benefit to maintaining the used substrate material and processing it in such a way that it can be reused. The invention lies, at least in part, in realizing the advantages of processing the material in such a way.

The track material may typically comprise copper.

The processing step may be adapted to ensure that the RF properties, for example the dielectric constant, of the layer of recycled material is the same, or substantially the same as that of the original substrate of the original printed circuit board.

The processing step may conserve the RF properties by conserving the ratio of products forming the layered substrate in the newly formed recycled layer.

The processing step of the method may comprise grinding the material to form a granulated powder, typically of the order of tens of microns in size. After grinding, the powder may then be further processed by extruding or pressing the ground material into the required thin layer, optionally with the application of heat and perhaps also increased pressure to melt the material. Alternatively, the ground material may be mixed with a warm liquid such as water to form a slurry, poured into a tray of a known depth and the liquid evaporated to leave a layer of the required thickness.

In each case, the method forms a thin layer of "felt" such as a matrix of PTFE, ceramic and omnidirectional glass fiber. The method may further comprise laying up the layer with one or more similar layers and laminating with a conductive material such as copper to form a new PCB substrate. Any glass fiber present in the layers of such a recycled material will be omni-directional, and the method may mix these with other layers of uni-directional glass fiber to form a substrate of the required properties. Optionally, one or more layers of pure PTFE "skive" may be mixed with the reformed layer (s) to give a substrate with the required properties.

The method may include a step of processing the pcb material to provide a recycled printed circuit board.

According to a second aspect the invention comprises a printed circuit board laminate formed at least partially from at least one layer of substrate recycled from radio frequency pcb substrate.

The printed circuit board laminate may be suitable for use in a microwave circuit, and may include one or more layers formed exclusively from recycled laminate material.

The invention may therefore also comprise a printed circuit board formed by processing of a printed circuit board laminate according to the second aspect.

Preferably the pcb laminate is a sheet like product having at least one layer of recycled dielectric material laminated to a sheet of copper or copper based material.

The recycled layer of the pcb laminate, recycled substrate, may be a thin layer of an omni-directional material such as a felt which can be obtained using the method of the first aspect of the invention. The sheet is preferably as thin as possible whilst being sufficiently thick to be handled without tearing when held under its own weight. Providing thinner sheets which can be laminated together to form the recycled pcb laminate product provides the greatest degree of freedom to provide products of differing thickness by laminating different numbers of layers.

The invention may further provide a microwave antenna for a mobile telephony network which includes a recycled microwave circuit board.

The board may be recycled by the method of the first aspect.

There will now be described, by way of example only, three embodiments of a method in accordance with an aspect of the present invention.

A typical microwave printed circuit board comprises a laminated substrate which carries a printed pattern of conductive tracks. The laminate typically, but not exclusively comprises a structure of copper laminated to a PTFE and glass fiber layer or layers, mixed in a suitable ratio to obtain a required dielectric constant.

DETAILED DESCRIPTION

The invention provides for a method of processing such boards in which the substrate is separated from the tracks and then processed to form new substrate. Three different processes are proposed (although others may be employed whilst remaining within the scope of the present invention). The processes are based on extrusion, pressing or evaporation of the separated and granulated substrate.

Method 1—Extrusion Process

To use extrusion to form the recycled material an apparatus is provided which comprises a hopper into which the separated and granulated substrate is placed. A heating element raises the temperature in the hopper to melt the contents which are then extruded through a letter boxed shaped aperture onto a moving support. The extruded material is then allowed to cool to form a layer of material. It is notable that PTFE is a thermoplastic and so can be re-melted above its melt temperature of 327° C.

Because the method uses the substrate separated from used pcbs and maintains the ratio of glass fibers to PTFE, the extruded layer will retain the dielectric properties of the original substrate. The layer will therefore be suitable for use in new, recycled, microwave PCB's.

Method 2—Pressing

An alternative is to use pressing to form a layer of recycled material. An apparatus for carrying out such a method comprises a support plate onto which the separated material is placed in a powder form. The plate is heated to melt, or partially melt, the powder. A pressing plate located above the support is pushed onto the powder to press it into a layer of the required thickness. Controlling the depth of the layer of powder on the support plate controls the density of the finished layer. After pressing, the plate is removed and the powder cooled.

Method 3—Evaporation

In this method, the separated and granulated material is ground to a powder and mixed with water (or another liquid) to form a slurry. The slurry is poured into a tray. The depth of the tray determines the depth of slurry. The liquid is then evaporated off to leave a layer of material of the required thickness.

In each of the three methods, the formed layer is then laid up with other similar layers and laminated with copper face sheets to form the required PCB laminate.

Where the invention is applied to recycling end of life products it is essential in a first step to remove the copper tracks from the support layer. This can be performed by placing the pcbs, either whole or cut into pieces, into a bath containing an etchant. The etchant removes the tracks and the remaining substrate can then be rinsed and dried.

In an alternative, the tracks could be ground off from the support layer. For example, the pcbs could be passed between a pair of contra-rotating grinding wheels. The spacing between the wheels should be set to equal the thickness of the pcb without the tracks. A conveyor may then carry the pcbs through the gap between the wheels. This could be combined with the use of an etchant to remove any remaining track material.

Of course, the invention could be applied to the recycling of off cuts which would otherwise be wasted during the manufacture of a pcb. Grinding and reforming the offcuts to form new pcbs is also envisaged within the scope of the invention.

The invention claimed is:

1. A method of recycling radio frequency printed circuit board laminate having a known dielectric constant, the method comprising:
   separating a substrate of a printed circuit board laminate from a track material of the printed circuit board laminate by placing the printed circuit board laminate into a bath containing an etchant so that the etchant removes the track material;
   grinding the substrate to form a granulated powder;
   processing the granulated powder to form a layer of substrate material suitable for relaminating with track material by pressing the granulated powder into the layer without the application of heat sufficient to melt the substrate material; and
   layering up the layer of substrate material with one or more similar layers and laminating with a conductive material to form a radio frequency printed circuit board laminate.

2. The method of claim 1 wherein the layer is laminated together with the similar layers and copper to form the radio frequency printed circuit board laminate.

3. The method of claim 1, further comprising:
   conserving the ratio of products forming the layer of substrate in the newly formed radio frequency printed circuit board laminate to ensure that the dielectric constant of the layer is the same as that of the substrate of the original printed circuit board laminate.

4. The method of claim 1, 2 or 3 wherein the layer of substrate material is felt-like and includes a matrix of polytetrafluoroethylene, ceramic and omnidirectional glass fiber.

5. The method of claim 1, 2 or 3, further comprising:
   processing the printed circuit board laminate to provide a recycled printed circuit board.

\* \* \* \* \*